(12) United States Patent
Seol et al.

(10) Patent No.: US 7,609,929 B2
(45) Date of Patent: Oct. 27, 2009

(54) SURFACE EMITTING DEVICE AND METHOD FOR FABRICATING THE SAME

(75) Inventors: Kwang Soo Seol, Suwon-si (KR); Byoung Ho Cheong, Seoul (KR); Jae Young Choi, Suwon-si (KR); Seong Jae Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/567,975

(22) Filed: Dec. 7, 2006

(65) Prior Publication Data

US 2007/0237479 A1  Oct. 11, 2007

(30) Foreign Application Priority Data

Apr. 10, 2006  (KR) ...................... 10-2006-0032461

(51) Int. Cl.
*G02B 6/032* (2006.01)
(52) U.S. Cl. ...................................... 385/125; 385/123
(58) Field of Classification Search ................. 385/123, 385/125
See application file for complete search history.

(56) References Cited

U.S. PATENT DOCUMENTS

| 2005/0111805 | A1 | 5/2005 | Hertz et al. |
| 2007/0138460 | A1* | 6/2007 | Choi et al. ..................... 257/13 |
| 2007/0177644 | A1* | 8/2007 | Corzine ................... 372/44.01 |

FOREIGN PATENT DOCUMENTS

| JP | 2001237616 | 8/2001 |
| JP | 2001237617 | 8/2001 |
| KR | 1020000018855 | 4/2000 |

* cited by examiner

*Primary Examiner*—Jennifer Doan
(74) *Attorney, Agent, or Firm*—Cantor Colburn LLP

(57) ABSTRACT

A surface emitting device using a photonic crystal includes a two-dimensional slab type photonic crystal structure including a first dielectric layer and a second dielectric layer formed on top of the first dielectric layer wherein a plurality of air holes in a two-dimensional lattice pattern are formed on the surface of the second dielectric layer; a light-emitting material layer formed on the inner wall of the air holes; and optical pumping means for irradiating the lateral surface of the photonic crystal structure with light. The surface emitting device shows improved surface emission efficiency and can advantageously emit light close to monochromatic light. Therefore, the surface emitting device can be used to manufacture a surface emitting laser. A method for fabricating the surface emitting device is also disclosed.

26 Claims, 10 Drawing Sheets

SURFACE EMITTING DEVICE AND METHOD FOR FABRICATING THE SAME

BACKGROUND OF THE INVENTION

This application claims priority to Korean Patent Application No. 10-2006-0032461, filed on Apr. 10, 2006, and all the benefits accruing therefrom under 35 U.S.C. § 119, the contents of which in its entirety are herein incorporated by reference.

1. Field of the Invention

The present invention relates to a surface emitting device using a photonic crystal and a method for fabricating the device. More particularly, the present invention relates to a surface emitting device including a two-dimensional slab type photonic crystal structure wherein quantum dots are formed on an inner wall defining air holes and are excited to emit light, and a method for fabricating the surface emitting device.

2. Description of the Related Art

Photonic crystals have a structure in which two materials having different refractive indices or dielectric constants are regularly arranged in a lattice pattern. This regular arrangement enables formation of a photonic bandgap, which acts to prevent a specific set of wavelengths of electromagnetic radiation from propagating into a photonic crystal. In the case where the photonic bandgap of a photonic crystal is in the visible range and the frequency or wavelength of light incident on the photonic crystal corresponds to the photonic bandgap, 99% or more of the incident light is theoretically reflected from the photonic crystal. In contrast, a large portion of light having a frequency or wavelength other than the photonic bandgap of a photonic crystal passes through the photonic crystal. For these reasons, photonic crystals are expected to considerably increase the ability to control of light. Because of such circumstances, photonic crystals are actively being investigated as potential materials for next-generation optical devices.

When light of a particular wavelength is generated in cavities formed within a photonic crystal, it collides with and is continuously reflected from the wall of the cavities, and as a result, the light is confined within the photonic crystal. The light confined within the small cavities is amplified and exits to produce laser light. Further, some waveguides, along which the confined light travels, may be formed within the photonic crystal to produce photonic integrated circuits.

Photonic bandgap structure materials using photonic crystals have been investigated around the world for their potential use in a variety of optoelectronic devices, particularly, microlasers, filters, high-efficiency light-emitting diodes ("LEDs"), optical switches and low-loss waveguides.

For example, U.S. Patent Application Publication No. 2005-111805 discloses an optical fiber comprising a guide region where light is confined, a plurality of holes in the optical fiber, and a plurality of quantum dots in the holes. According to this publication, excitation light for exciting the quantum dots formed within the holes is also confined within the optical fiber and then exits in the same direction as a wave emitted from the quantum dots, thus making surface emission impossible.

Further, Korean Patent Laid-open No. 2000-018855 discloses a photosensitive device using quantum islands wherein the device comprises a first quantum island layer containing quantum dots, a light-absorbing layer including at least one quantum island layer, which is formed by alternately forming materials having a bandgap different from that of the first quantum island layer, a conductive path layer where carriers excited from the light-absorbing layer are collected to cause horizontal conduction, an impurity layer, and two or more detection electrodes for horizontally conducting the carriers, which are excited by receiving light excited from the light-absorbing layer, collected in channels. According to the photosensitive device, the quantum island layer detects light and emits carriers corresponding to the detected light. Accordingly, the photosensitive device can be used as a light-emitting diode, a laser diode, or the like.

The aforementioned prior art publications however fail to disclose a surface emitting device wherein light exits toward the surface of the device. Therefore, there is a need to develop a surface emitting device that can emit light toward the surface of the device and that can control the emission of light that is close to monochromatic light.

BRIEF SUMMARY OF THE INVENTION

Therefore, the present invention has been made to meet the technical need in the art, and it is one aspect of the present invention to provide a surface emitting device with high surface emission efficiency and capable of controlling the emission wavelength of light close to monochromatic light.

It is another aspect of the present invention to provide a method for fabricating a surface emitting device wherein light exits toward the surface of the device and is emitted so that it is very close to monochromatic light.

It is yet another aspect of the present invention to provide an optoelectronic device using the surface emitting device.

In accordance with one exemplary embodiment of the present invention, there is provided a surface emitting device which comprises a two-dimensional slab type photonic crystal structure including a first dielectric layer and a second dielectric layer formed on top of the first dielectric layer wherein a plurality of air holes in a two-dimensional lattice pattern are formed on the surface of the second dielectric layer, a light-emitting material layer formed on the inner wall of the air holes, and optical pumping means for irradiating the lateral surface of the photonic crystal structure with light.

The first dielectric layer of the photonic crystal structure has a lower dielectric constant than the second dielectric layer. The size and geometry of the air holes formed within the second dielectric layer must be adjusted in such a manner that the optical bandgap of the photonic crystal matches the emission wavelength of a material for the light-emitting material layer.

In accordance with another exemplary embodiment of the present invention, there is provided a method for fabricating a surface emitting device. The method includes: forming a first dielectric layer on a substrate; forming a second dielectric layer on the first dielectric layer and patterning the second dielectric layer to form a patterned photonic crystal structure; coating a polymer electrolyte on the patterned photonic crystal structure to form a polymer electrolyte layer; and coating a light-emitting material on the polymer electrolyte layer to form a light-emitting material layer.

In accordance with yet another exemplary embodiment of the present invention, there is provided an optoelectronic device including the exemplary surface emitting device.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

The present invention will now be described in greater detail with reference to the accompanying drawings.

It will be understood in the following disclosure of the present invention, that as used herein, the singular forms "a", "an" and "the" are intended to include the plural forms as well, unless the context clearly indicates otherwise. It will be further understood that the terms "comprise", "comprises", and "comprising," when used in this specification, specify the presence of stated features, integers, steps, operations, elements, components, groups and combination of the foregoing, but do not preclude the presence and/or addition of one or more other features, integers, steps, operations, elements, components, groups, and combination of the foregoing.

It will be understood that when an element is referred to as being "on" another element, or when an element is referred to as being "disposed between" two or more other elements, it can be directly on (i.e., in at least partial contact with) the other element(s), or an intervening element or elements may be present therebetween. In contrast, when an element is referred to as being "disposed on" another element, the elements are understood to be in at least partial contact with each other, unless otherwise specified. Spatially relative terms, such as "between", "in between" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. The device may be otherwise oriented (rotated 90 degrees, inverted, or at other orientations) and the spatially relative descriptors used herein interpreted accordingly. Likewise, use of the term "opposite", unless otherwise specified, means on the opposing side or surface of the element. For example, where a surface of a layer is said to be opposite another surface or element, it is located on the opposing surface of the layer coplanar with the first surface unless otherwise specified.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1A:
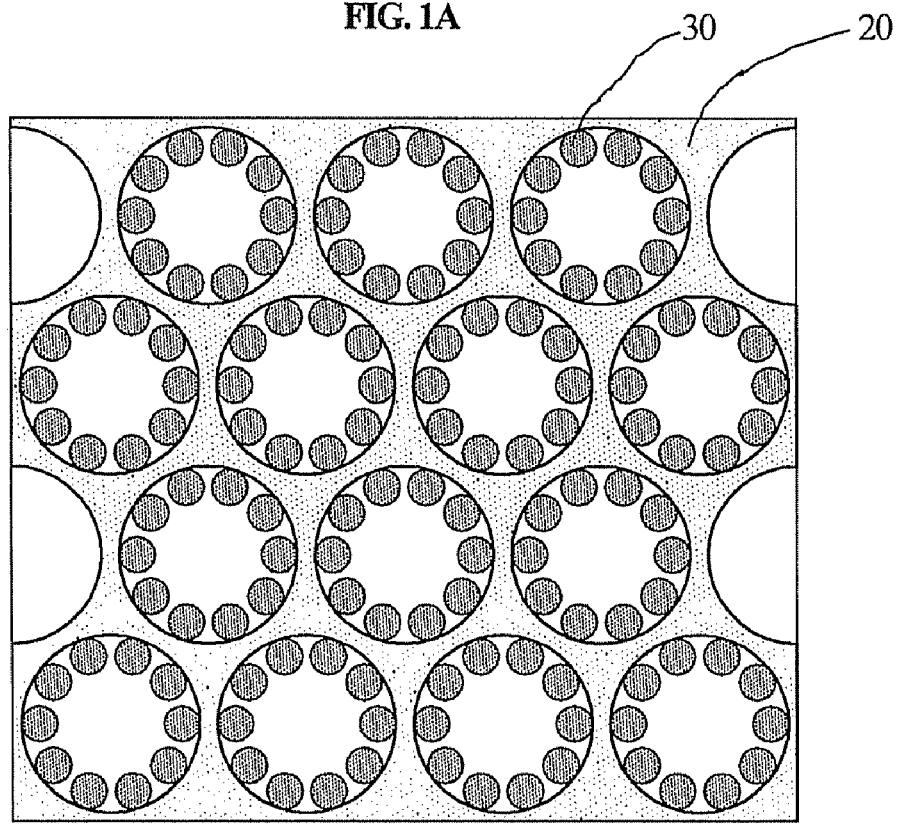
FIGS. 1A, 1B and 1C are a plan view, a schematic cross-sectional view and a perspective view, respectively, of a surface emitting device according to an exemplary embodiment of the present invention.
Figure 1B:
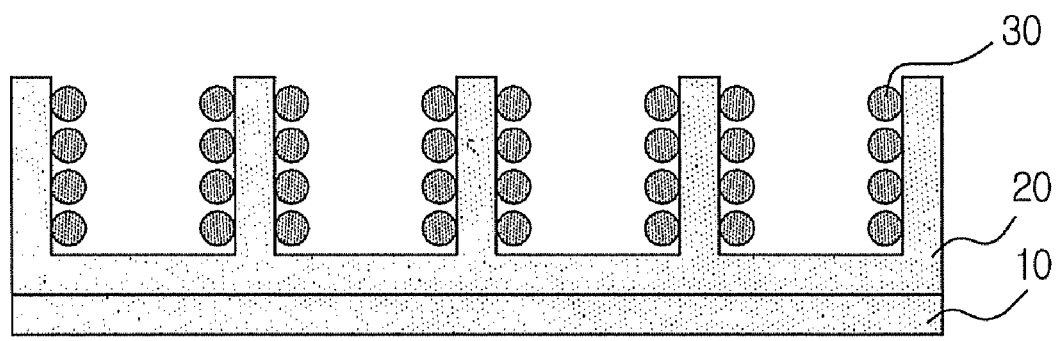

FIGS. 1A and 1B are a plan view and a side cross-sectional view, respectively, of a surface emitting device according to an exemplary embodiment of the present invention.

The surface emitting device is provided, which comprises a first dielectric layer and a second dielectric layer having a plurality of air holes in a planar slab wherein a light-emitting material layer is formed on an inner wall of the air holes.

Referring to FIGS. 1A and 1B, the surface emitting device of the present invention comprises a two-dimensional slab type photonic crystal structure including a first dielectric layer 10 and a second dielectric layer 20 formed on top of the first dielectric layer wherein a plurality of air holes in a two-dimensional lattice pattern are formed on the surface of the second dielectric layer 20, a light-emitting material layer 30 formed on the inner wall of the air holes, and optical pumping means (not shown) for irradiating the lateral surface of the photonic crystal structure with light.

Figure 1C:
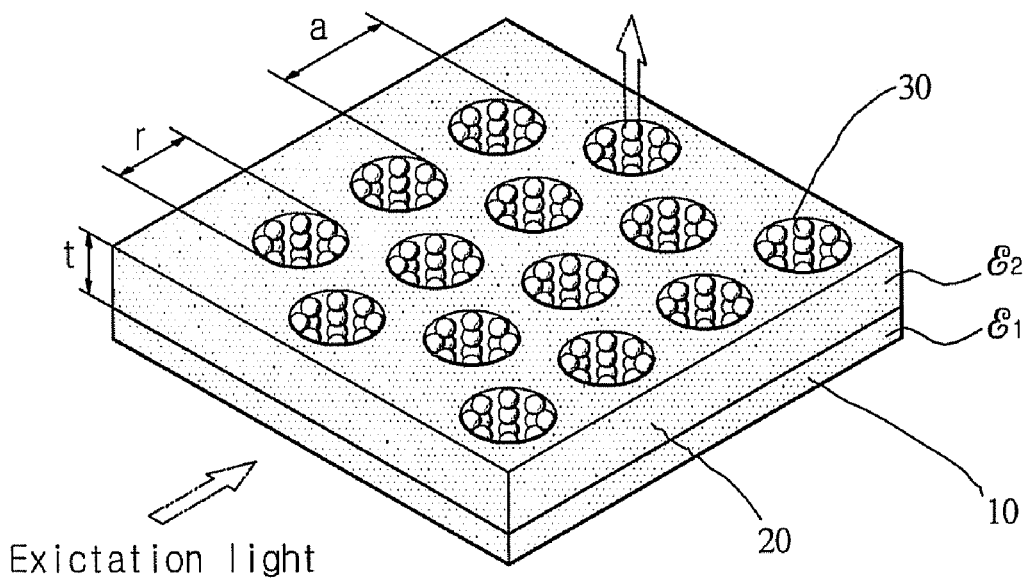

FIG. 1C is a perspective view showing a photonic crystal structure of a surface emitting device according to one embodiment of the present invention. The photonic crystal structure includes a first dielectric layer 10 and a second dielectric layer 20, and has a two-dimensional periodic structure.

The size and geometry (e.g., shape and arrangement) of air holes formed in the second dielectric layer 20 is adjusted in such a manner that the optical bandgap of the photonic crystal matches the emission wavelength of the light-emitting material 30.

The second dielectric layer 20 formed on the first dielectric layer 10 has a two-dimensional periodic structure. For example, the second dielectric layer 20 may have a regular square or triangular lattice pattern of cylindrical air holes. The cross-sectional shape of the air holes may be rectangular instead of circular, or a combination comprising at least one of the foregoing shapes.

Figure 2A:
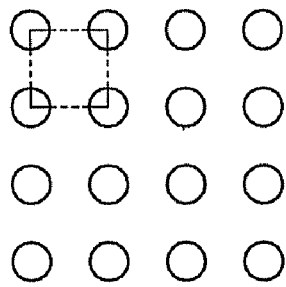
FIGS. 2A to 2D are diagrams showing lattice patterns of a photonic crystal structure of a surface emitting device according to an exemplary embodiment of the present invention.
Figure 2B:
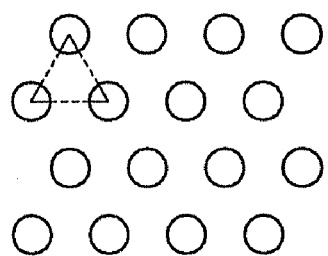
Figure 2C:
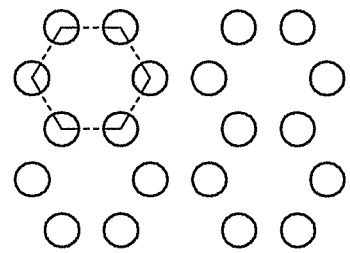
Figure 2D:
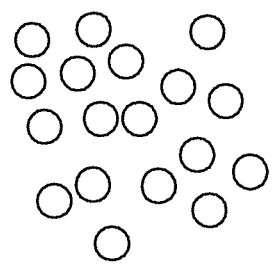

FIGS. 2A to 2D show patterns of air holes formed within the second dielectric layer 20. The air holes may be arranged in a square lattice pattern (FIG. 2A), a triangular lattice pattern (FIG. 2B), or a honeycomb pattern (FIG. 2C). Further, the air holes may be randomly distributed (FIG. 2D).

The first dielectric layer 10 and the second dielectric layer 20 may be formed of any suitable material selected from ceramic materials, polymeric materials, photocurable resins and dielectric ceramic materials, or a combination comprising at least one of the foregoing materials. The dielectric layers 10 and 20 are preferably formed of a ceramic material.

The first dielectric layer 10 of the photonic crystal structure is formed of a low-relative dielectric constant material selected from ceramic materials, synthetic glass materials, plastic materials, land the like. For example, the first dielectric layer 10 may be formed of $SiO_2$ ceramic, Pyrex® glass (e.g., borosilicate glass), quartz glass, acrylics, or the like. The materials for the first dielectric layer preferably have a relative dielectric constant of 7 or lower.

As suitable ceramic materials for the second dielectric layer 20, high-relative dielectric constant ceramic materials, synthetic glass materials, and the like, may be used. Specifically, the second dielectric layer 20 may be formed of a material selected from the group consisting of, but not limited to, $BaO\text{—}Nd_2O_3\text{—}TiO_2\text{—}B_2O_3\text{—}ZnO_2\text{—}CuO$, $Al_2O_3\text{—}TiO_2$, $TiO_2$, $BaO\text{—}Bi_2O_3\text{—}Nd_2O_3\text{—}TiO_2$, $BaO\text{—}Bi_2O_3\text{—}Nd_2O_3\text{—}TiO_2\text{—}SrTiO_3$, $BaO\text{—}PbO\text{—}Nd_2O_3\text{—}TiO_2$, $Ba(Zn, Nb)O_3$, $BaTi_4O_9$, $(Zr, Sn)TiO_4$, $Ba(Zn, Ta)O_3$, $Ba(Mg, Ta)O_3$, and $MgTiO_3\text{—}CaTiO_3$ ceramic materials. The materials for the second dielectric layer 20 preferably have a relative dielectric constant of 20 or higher.

The light-emitting material layer 30, which is formed on the inner wall of the air holes of the photonic crystal structure of the surface emitting device according to the present invention, may be formed of quantum dots or other light-emitting materials. In an exemplary embodiment, the light-emitting material layer 30 is formed of quantum dots. The quantum dots can be selected from the group consisting of quantum dots of Group II-VI compounds, Group II-V compounds, Group III-VI compounds, Group III-V compounds, Group IV-VI compounds, Group I-III-VI compounds, Group II-IV-VI compounds, and Group II-IV-V compounds. As disclosed herein, such compounds include a combination of elements from two or more groups from the periodic chart. For example, a Group II-VI compound means a compound that includes an element of Group II and an element of Group VI. Specific examples of possible compounds for the quantum dots include, but are not limited to, CdS, CdSe, CdTe, ZnS, ZnSe, ZnTe, GaN, GaP, GaAs, GaSb, AlN, AlP, AlAs, AlSb, InP, InAs, InSb, SiC, Fe, Pt, Ni, Co, Al, Ag, Au, Cu, FePt, $Fe_2O_3$, $Fe_3O_4$, Si, Ge or a combination comprising at least one of the foregoing.

The quantum dots may have a core-shell structure in which an overcoating is formed on a core. The overcoating may contain at least one material selected from the group consisting of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, or a combination comprising at least one of the foregoing materials.

The quantum dots are surface-coated with a dispersant, such as mercaptoacetic acid ("MAA") to render the surface of the quantum dots negatively charged, and are dispersed in an aqueous solution.

The optical pumping means of the surface emitting device according to the present invention serves to irradiate the photonic crystal structure, in which the light-emitting material layer is formed on the inner wall of the air holes, with light in an in-plane direction with respect to the photonic crystal structure to excite the quantum dots. The optical pumping means may be a light-emitting diode or a laser diode, for example.

The operational principle of the surface emitting device according to the present invention will be explained below.

Pumping light (excitation light) is generated by the action of the optical pumping means, and is incident on the two-dimensional slab type photonic crystal structure in an in-plane direction of the photonic crystal structure. The incident excitation light is guided by the photonic crystal slab and propagates in an in-plane direction of the slab. At this time, the quantum dots emit light by the excitation light. The light emitted from the quantum dots propagates in a direction perpendicular to the slab by the photonic crystal and exits toward the surface of the light-emitting device.

Figure 3A:
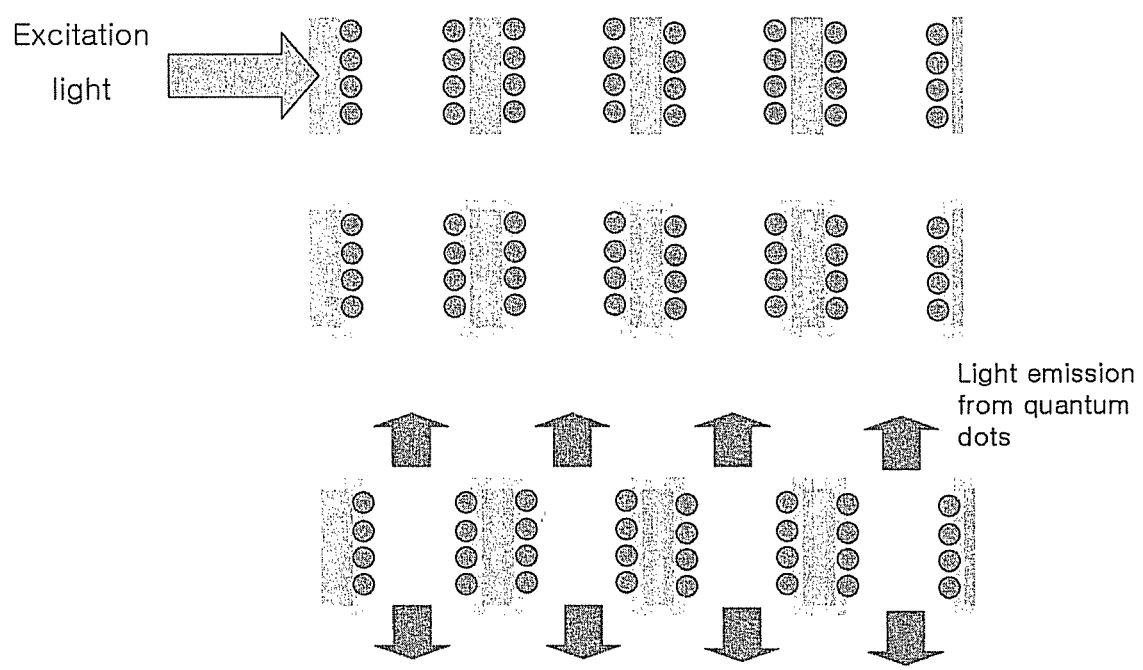
FIG. 3A schematically illustrates the mechanism of light emission from a surface emitting device according to an exemplary embodiment of the present invention.

Referring to FIG. 3A, a portion of the pumping light (excitation light) incident on the photonic crystal leaks from the surface of the air holes to excite the quantum dots 30 attached to the surface of the air holes, thus allowing the quantum dots to emit light. When light incident on the photonic crystal (i.e., laterally incident light) of the light emitted from the quantum dots has a wavelength corresponding to the bandgap wavelength of the photonic crystal, it cannot propagate through the photonic crystal and is thus reflected from the photonic crystal. As a result, the light exits in a surface direction through the air holes.

Figure 3B:
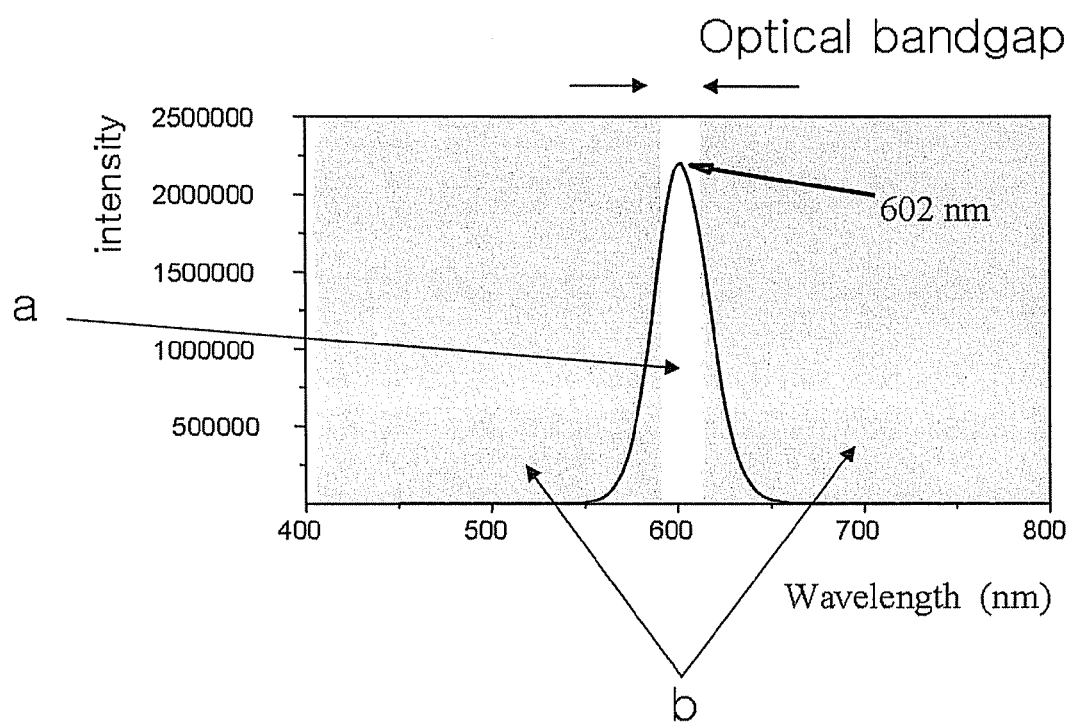
FIG. 3B is a graph showing photonic bandgap characteristics of a surface emitting device according to an exemplary embodiment of the present invention.

The portion 'a' shown in FIG. 3B represents light having a wavelength corresponding to the bandgap wavelength of the photonic crystal. The light cannot propagate through the photonic crystal. The portions 'b' represent light that is emitted but whose portion laterally penetrates the photonic crystal and disappears in the photonic crystal.

The wavelength (optical bandgap) of light confined by the photonic crystal may be controlled by varying the size of the holes formed within the two-dimensional slab type photonic crystal, the intervals between the holes, the shape of the holes, and the refractive index of the material for the second dielectric layer 20, so that the whole or a portion of the light emitted from the quantum dots 30 can be emitted in a direction perpendicular to the slab.

Figure 4:
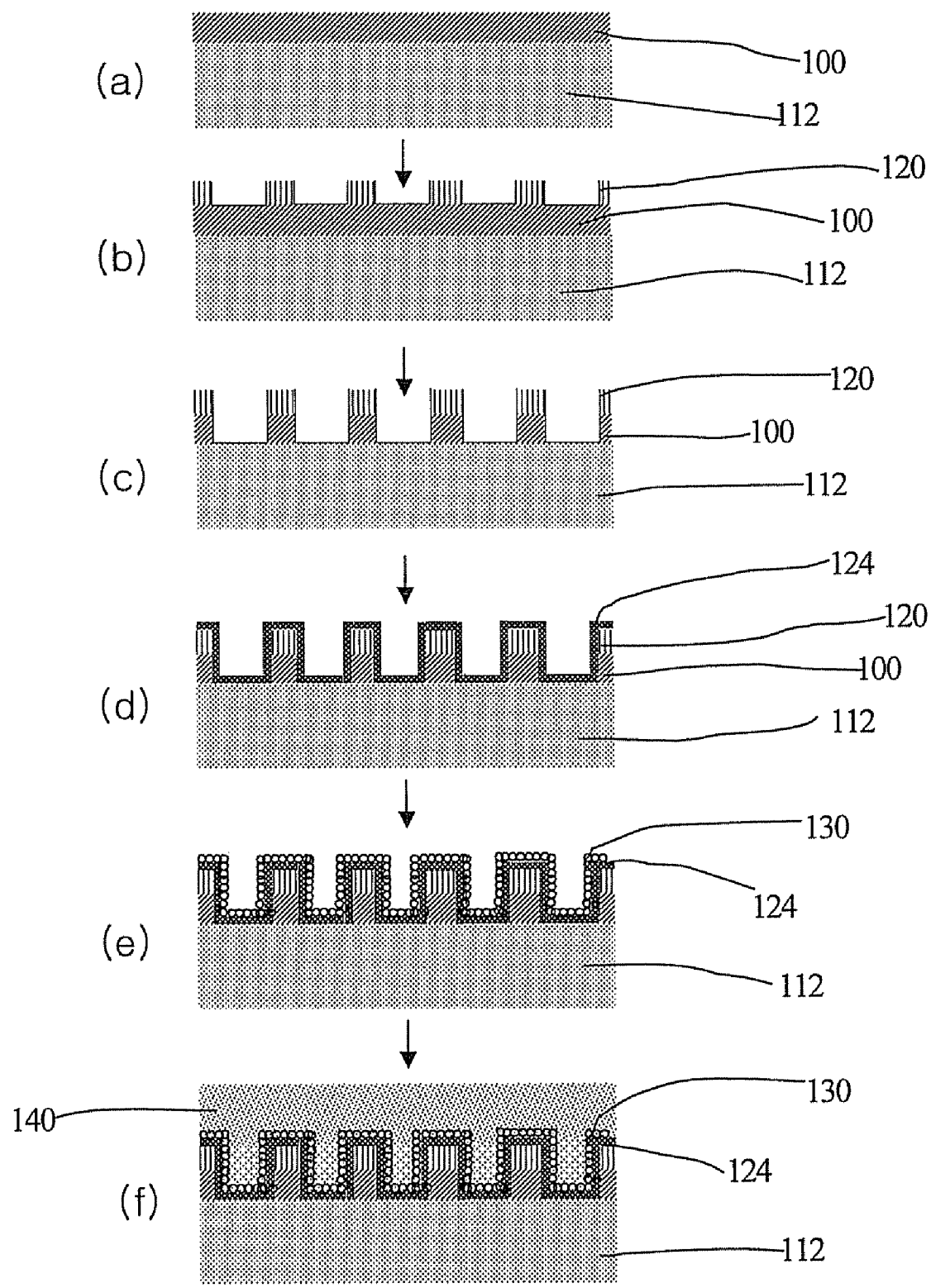
FIG. 4 is a process flow diagram illustrating a method for fabricating a surface emitting device according to an exemplary embodiment of the present invention.

In another aspect, the present invention is related to a method for fabricating a surface emitting device. FIG. 4 is a process flow diagram of an exemplary embodiment of a method for fabricating a surface emitting device according to an exemplary embodiment of the present invention. With reference to FIG. 4, the method of the present invention will be explained. First, a material for a first dielectric layer 100 is deposited on a substrate 112 to form the first dielectric layer 100. Subsequently, a second dielectric layer 120 is formed on the first dielectric layer 100 and then the second dielectric layer 120 is patterned to form a patterned photonic crystal structure. Next, a polymer electrolyte is coated on the patterned photonic crystal structure to form a polymer electrolyte layer 124. Finally, a light-emitting material is coated on the polymer electrolyte layer to form a light-emitting material layer 130. Optionally, a protective layer 140 may be formed using $SiO_2$ or polymethylmethacrylate on the light-emitting material layer 130.

The photonic crystal structure of the present invention can be fabricated without any particular limitation by any known technique in the art. Generally, the photonic crystal can be produced using two or more materials having different dielectric constants. In the case of general two-dimensional slab type photonic crystals, the dielectric constant ($\in 1$) of a first dielectric layer 100 constituting a slab is lower than that ($\in 2$) of a second dielectric layer 20 (FIG. 1C). See, Japanese Unexamined Patent Publication Nos. 2001-237616 and 2001-237617 in connection with the production of photonic crystals.

The formation of the first dielectric layer 100 on the substrate 112 can be performed by sol-gel processes, chemical vapor deposition, sputtering, etc.

The patterning of the photonic crystal structure can be performed by e-beam lithography, laser interference lithography, deep UV photolithography, etc.

Specifically, the patterning of the photonic crystal is performed by forming a photosensitive film over the entire surface of the first dielectric layer 100, followed by light exposure and developing to obtain a photosensitive film pattern. Then, chemical etching is carried out using the photosensitive film pattern as a mask to form the desired photonic crystal structure. The two-dimensional slab type photonic crystal structure has a triangular lattice or regular square lattice pattern of cylindrical air holes. The chemical etching may be carried out by wet or dry etching.

The wet etching involves the use of an etchant, such as an aqueous acetic acid solution, hydrofluoric acid or an aqueous phosphoric acid solution, and the dry etching involves the use of gas, plasma or ion beam. A reactive ion etching ("RIE") process wherein a reactive gas is activated in a plasma state to cause a chemical reaction with a material being etched, rendering the material volatile, or an inductive coupled plasma-reactive ion etching ("ICP-RIE") process wherein inductive coupled plasma ("ICP") is used as an activation source, can be employed for the dry etching.

The coating of the light-emitting material 130 is carried out by coating a dispersion of quantum dots or other light-emitting materials using drop casting, spin coating, dip coating, spray coating, flow coating, screen printing, or ink-jet printing, for example, but is not limited thereto.

Examples of suitable light-emitting materials 130 other than quantum dots include low-molecular weight organic light-emitting materials, such as coumarin and rhodamine type materials, high-molecular weight phosphorescent materials, and organic electroluminescent ("EL") materials.

The polymer electrolyte is selected from positively charged polymer electrolytes, e.g., polyallylamine and polyethylene imine, negatively charged polymer electrolytes, e.g., polyacrylic acid and polysulfonic acid, and salts thereof. The coating of the polymer electrolyte is carried out by drop casting, spin coating, or dip coating, for example, but is not limited thereto. The polymer electrolyte is coated to make the surface of the second dielectric layer 120 positively charged.

In still another aspect, the present invention is related to an optoelectronic device comprising the exemplary surface emitting device described above.

The surface emitting device of the present invention can find applications in a variety of optoelectronic devices, such as microlasers, filters, high-efficiency light-emitting diodes ("LEDs"), optical switches and low-loss waveguides, for example, but is not limited thereto.

Figure 5:
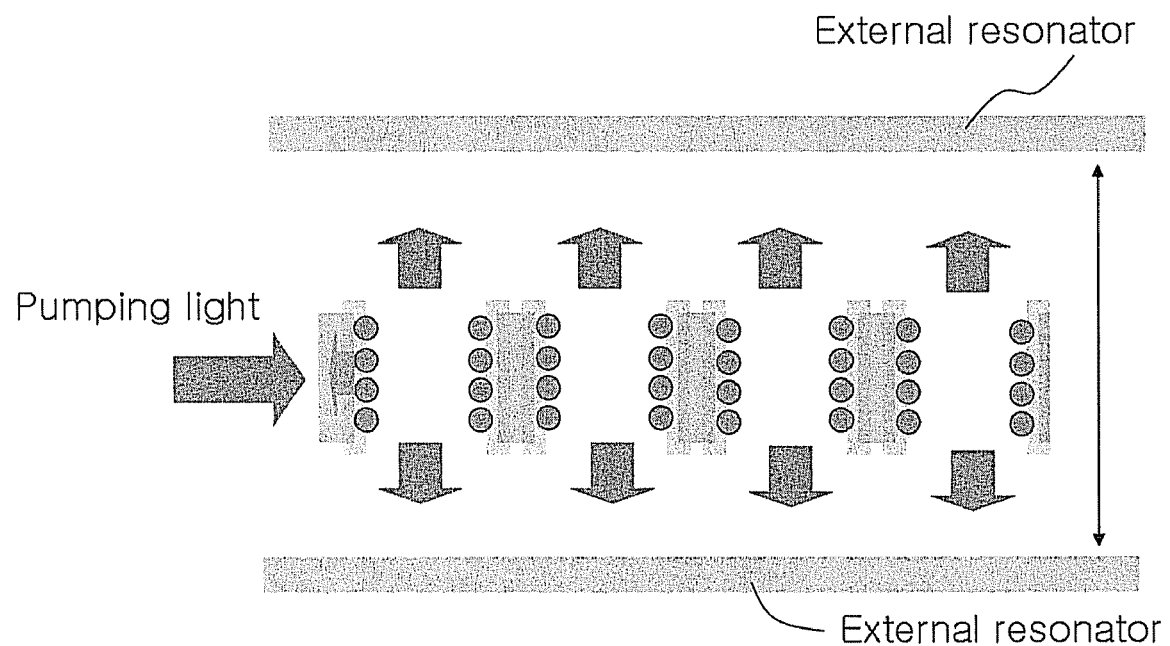
FIG. 5 is a schematic cross-sectional view of a surface emitting laser according to an exemplary embodiment of the present invention.

Particularly, the surface emitting device of the present invention can be used to manufacture surface emitting lasers. FIG. 5 shows a surface emitting laser according to an exemplary embodiment of the present invention. The surface emitting laser shown in FIG. 5 comprises an external resonator consisting of a pair of mirrors and the exemplary surface emitting device disposed within the external resonator.

The surface emitting laser amplifies light to emit laser light, based on the resonance phenomenon. The surface emitting laser of the present invention may further comprise a cutoff filter disposed in a region other than the second dielectric layer.

EXAMPLES

Example 1-5

$TiO_2$ was deposited on a $SiO_2$ substrate by chemical vapor deposition to form a first dielectric layer. A photoresist composition was applied to the first dielectric layer, followed by baking to form a photosensitive film. The photosensitive film was exposed to light to form a photosensitive film pattern. Chemical etching was carried out using the photosensitive film pattern as a mask and a solution of $HCl:H_2O$ (4:1) as an etchant to achieve patterning of a photonic crystal structure. At this time, the size and the geometry of air holes formed within a second dielectric layer were varied as indicated in Table 1.

Next, a 10 mM solution of polyallylamine hydrochloride ("PAH") as a polymer electrolyte was spin-coated on the patterned photonic crystal structure, and CdSe nanoparticles capped with mercaptoacetic acid ("MAA") were applied to the polymer electrolyte layer to form a monolayer of the CdSe nanoparticles.

A coating solution of polymethylmethacrylate ("PMMA") in methylene chloride was applied to the monolayer and dried to fabricate a surface emitting device. A 450-460 nm laser diode was used as pumping means. The characteristics of the surface emitting device were evaluated.

TABLE 1

| Example No. | $\epsilon_1$ | $\epsilon_2$ | a | r | t |
|---|---|---|---|---|---|
| Example 1 | 3.9 | 25 | 136 nm | 53 nm | 82 nm |
| Example 2 | 3.9 | 50 | 103 nm | 40 nm | 62 nm |
| Example 3 | 3.9 | 80 | 82 nm | 32 nm | 49 nm |
| Example 4 | 3.9 | 25 | 155 nm | 60 nm | 93 nm |
| Example 5 | 3.9 | 25 | 117 nm | 46 nm | 70 nm |

Experimental Example 1

Surface emitting devices were fabricated in the same manner as in Example 1, except that the geometry of the photonic crystal structure was varied as indicated in Table 1. The characteristics of the surface emitting devices were evaluated.

1. Color tuning

Figure 6A:
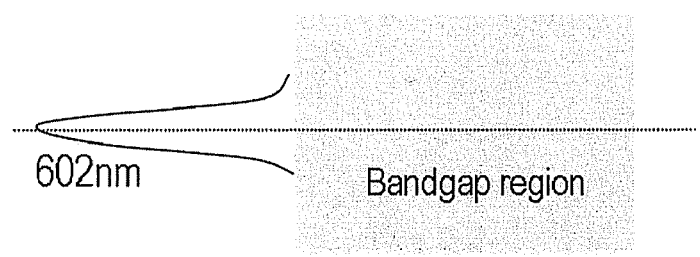
FIGS. 6A to 6C are diagrams illustrating the color tuning of surface emitting devices fabricated in Examples 1, 4 and 5.
Figure 6B:
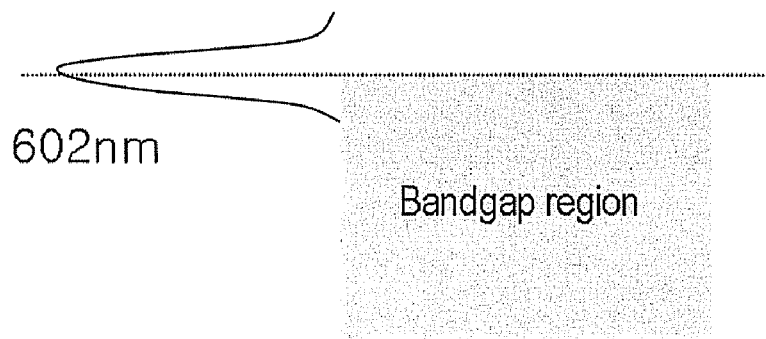
Figure 6C:
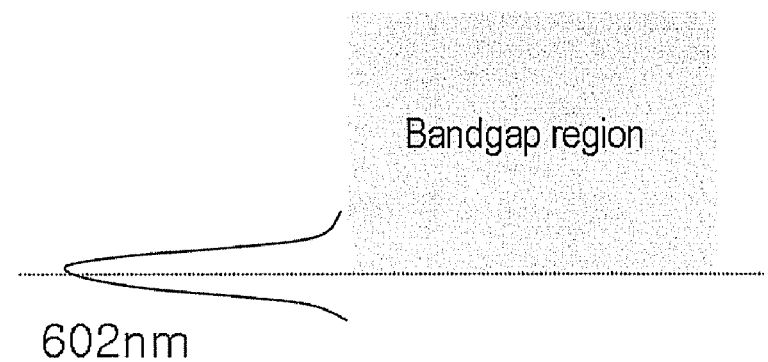

The bandgap regions of the surface emitting devices fabricated in Examples 1, 4 and 5 were measured, and the results are shown in FIGS. 6A, 6B and 6C, respectively. The graph of FIG. 6A indicates that the surface emitting device fabricated in Example 1 can reflect and project the overall region of the spectrum emitted from the quantum dots, which were attached to the surface of the air holes of the photonic crystal structure. Referring to FIG. 6B, the surface emitting device fabricated in Example 4 reflects and projects only an upper half of the spectrum region emitted from the quantum dots. Referring to FIG. 6C, the surface emitting device fabricated in Example 5 reflects and projects only a lower half of the spectrum region emitted from the quantum dots. From the graphs of FIGS. 6A to 6C, it can be confirmed that the emission bands of the surface emitting devices can be tuned to the desired emission wavelength bands by suitably controlling the lattice constant of the photonic crystal structures.

2. Changes in emission characteristics according to changes in geometry of air holes The emission characteristics of the photonic structures, where the dielectric constant of the second dielectric layer was greatest ($\in 1=3.9$, $\in 2=80$) and the dielectric constant of the second dielectric layer was lowest ($\in 1=3.9$, $\in 2=25$), were evaluated by varying the diameter of air holes at a fixed thickness of the slab. At this time, the maximum emitted peak width of the photonic structures was calculated by the following equation 1, and the results are shown in Table 2 and FIGS. 7A to 7C.

Emitted Peak Width(%)=(Full Width at Half Maximum(FWHM)/Spectrum region emitted from the quantum dots )*100 (1)

TABLE 2

| | $\epsilon_1 = 3.9, \epsilon_2 = 80$ | | | $\epsilon_1 = 3.9, \epsilon_2 = 25$ | | |
|---|---|---|---|---|---|---|
| r/a | 0.30 | 0.35 | 0.40 | 0.30 | 0.35 | 0.40 |
| Up | 0.139 | 0.154 | 0.184 | 1.178 | 0.189 | 0.259 |
| Down | 0.103 | 0.109 | 0.122 | 0.170 | 0.179 | 0.239 |
| Width | 29.7% | 34.2% | 40.5% | 4.6% | 5.4% | 8.0% |

Figure 7A:
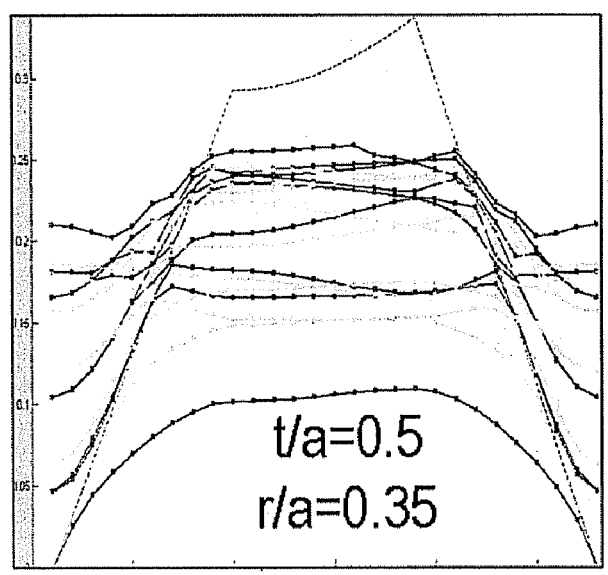
FIGS. 7A to 7C are graphs showing changes in emission characteristics at various diameters (r) of air holes of surface emitting devices fabricated in Examples 1 to 5.
Figure 7B:
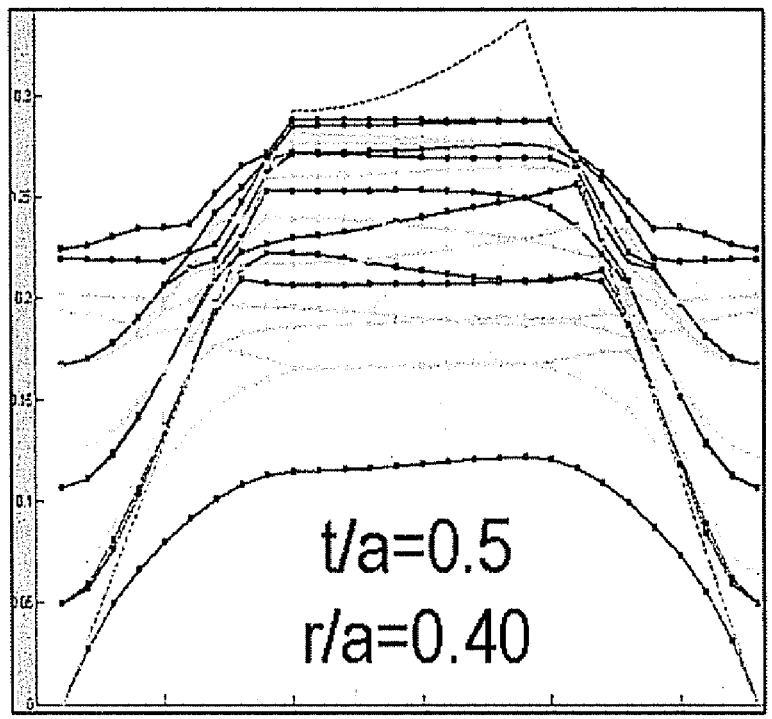
Figure 7C:
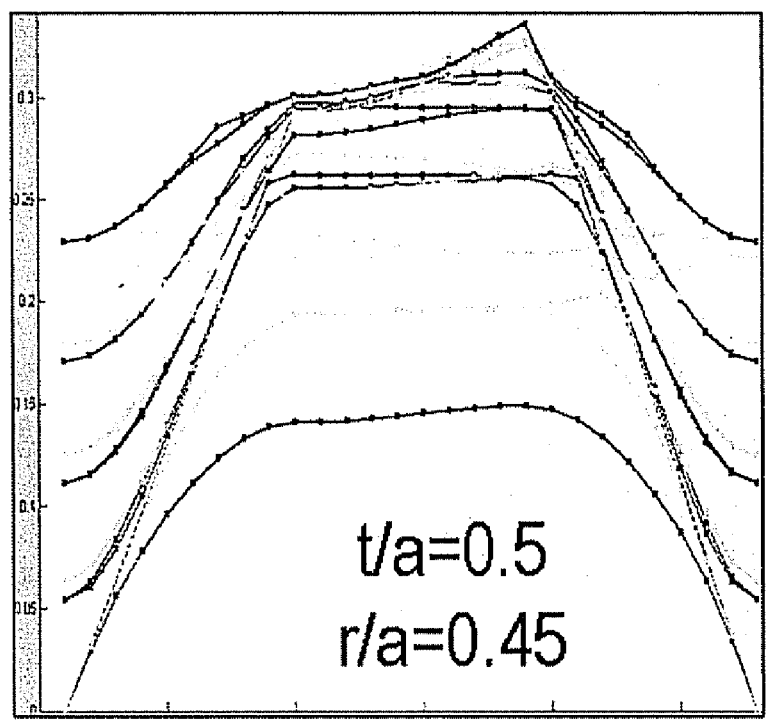

As can be seen from the results of Table 2 and FIGS. 7A to 7C, the TM bandgap width was increased and the intervals between TE and TM bandgaps were increased with increasing thickness of the air holes at a fixed thickness of the slab.

Figure 8A:
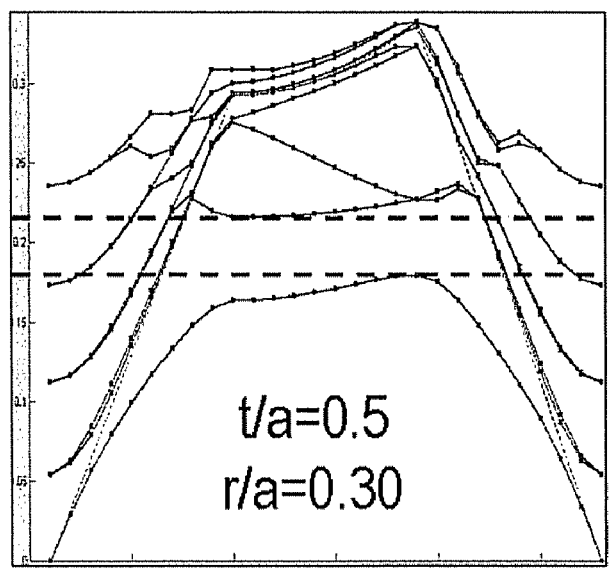
FIGS. 8A to 8C are graphs showing changes in emission characteristics at various slab thicknesses (t) of surface emitting devices fabricated in Examples 1 to 5.
Figure 8B:
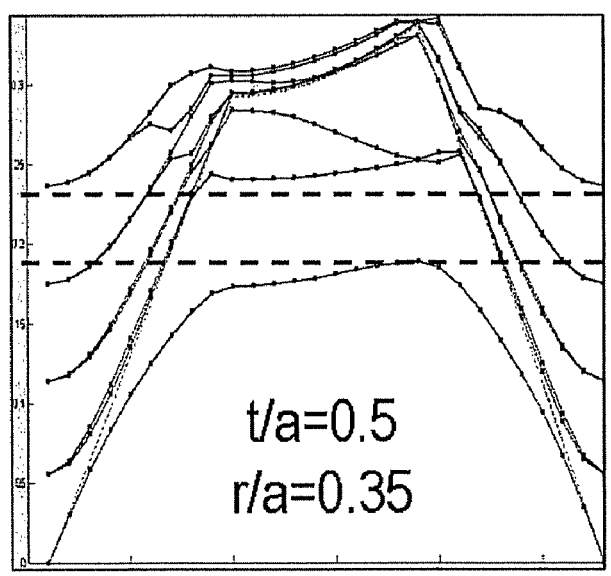
Figure 8C:
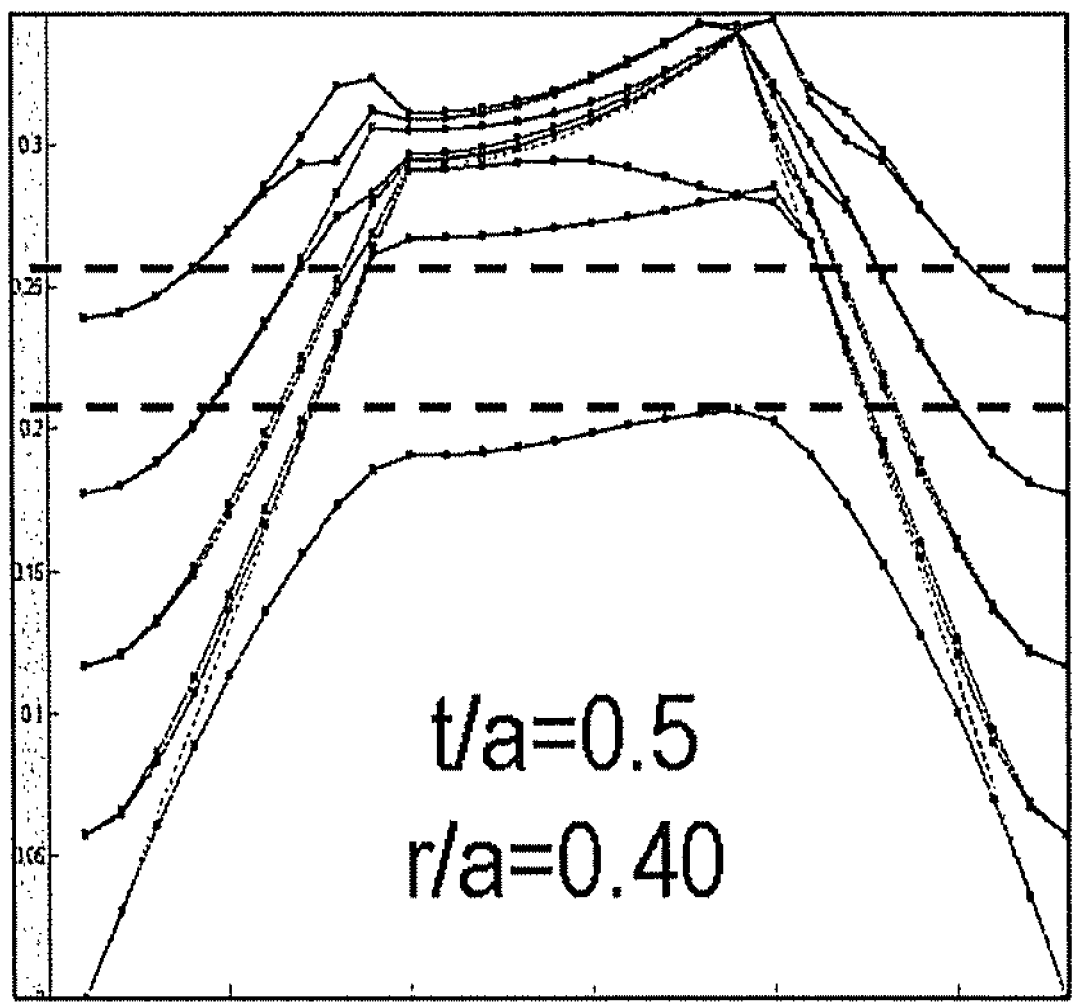

On the other hand, the above procedure was repeated by varying the thickness (t) of the slab at a fixed thickness of the air holes, and the results are shown in Table 3 and FIGS. 8A to 8C.

TABLE 3

| r/a | 0.35 | 0.36 | 0.37 | 0.38 | 0.39 | 0.40 | 0.41 | 0.42 | 0.43 | 0.45 |
|---|---|---|---|---|---|---|---|---|---|---|
| Up | 0.230 | 0.230 | 0.230 | 0.238 | 0.252 | 0.261 | 0.261 | 0.261 | 0.262 | 0.262 |
| Down | 0.183 | 0.186 | 0.189 | 0.192 | 0.195 | 0.200 | 0.205 | 0.210 | 0.217 | 0.233 |
| Width (%) | 22.7 | 21.1 | 19.5 | 21.4 | 25.5 | 26.5 | 24.0 | 21.6 | 18.8 | 11.7 |

The results of Table 3 show that the TE gap (26.5%) was greatest when t/a and r/a were 0.6 and 0.40, respectively.

As apparent from the above description, the surface emitting device of the present invention shows improved surface emission efficiency and can control the emission wavelength of quantum dots closer to monochromatic light. In addition, a structure in which a particular band only is reflected and projected can be attained by controlling the lattice constant of the photonic crystal structure.

Since the surface emitting laser of the present invention, which comprises the exemplary surface emitting device, shows high surface emission efficiency and has very small cavities where light is generated, it requires very low energy consumption to operate. Therefore, the surface emitting laser can be widely utilized in optoelectronic technologies, such as ultrahigh speed and high-efficiency optical communications and optical computers.

Although exemplary embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A surface emitting device, comprising:
   a two-dimensional slab type photonic crystal structure including a first dielectric layer and a second dielectric layer having a different dielectric constant than the first dielectric layer and formed on top of the first dielectric layer, wherein a plurality of air holes in a two-dimensional lattice pattern are formed on a surface of the second dielectric layer;
   a light-emitting material layer formed on an inner wall defining the air holes; and
   optical pumping means for irradiating a lateral surface of the photonic crystal structure with light.

2. The surface emitting device according to claim 1, wherein the first dielectric layer of the photonic crystal structure has a lower dielectric constant than a dielectric constant of the second dielectric layer.

3. The surface emitting device according to claim 1, wherein a size and geometry of the air holes is adjusted in such a manner that an optical bandgap of the photonic crystal matches an emission wavelength of a material for the light-emitting material layer.

4. The surface emitting device according to claim 1, wherein the air holes formed within the second dielectric layer are arranged in at least one of triangular lattice, a square lattice, a honeycomb, a random pattern, and a combination comprising at least one of the foregoing.

5. The surface emitting device according to claim 1, wherein the first dielectric layer is formed of a material selected from the group consisting of $SiO_2$ ceramic materials, Pyrex glass, quartz glass, and acrylics.

6. The surface emitting device according to claim 1, wherein the first dielectric layer is formed of a material having a relative dielectric constant of 7 or lower.

7. The surface emitting device according to claim 1, wherein the second dielectric layer is formed of a material selected from the group consisting of $BaO$—$Nd_2O_3$—$TiO_2$—$B_2O_3$—$ZnO_2$—$CuO$, $Al_2O_3$—$TiO_2$, $TiO_2$, $BaO$—$Bi_2O_3$—$Nd_2O_3$—$TiO_2$, $BaO$—$Bi_2O_3$—$Nd_2O_3$—$TiO_2$—$SrTiO_3$, $BaO$—$PbO$—$Nd_2O_3$—$TiO_2$, $Ba(Zn, Nb)O_3$, $BaTi_4O_9$, $(Zr, Sn)TiO_4$, $Ba(Zn, Ta)O_3$, $Ba(Mg, Ta)O_3$, and $MgTiO_3$—$CaTiO_3$ ceramic materials.

8. The surface emitting device according to claim 1, wherein the second dielectric layer is formed of a material having a relative dielectric constant of 20 or higher.

9. The surface emitting device according to claim 1, wherein the light-emitting material layer contains quantum dots.

10. The surface emitting device according to claim 9, wherein the quantum dots are selected from the group consisting of quantum dots of Group II-VI compounds, Group II-V compounds, Group III-VI compounds, Group III-V compounds, Group IV-VI compounds, Group I-III-VI compounds, Group II-IV-VI compounds, and Group II-IV-V compounds.

11. The surface emitting device according to claim 10, wherein the quantum dots are selected from the group consisting of CdS, CdSe, CdTe, ZnS, ZnSe, ZnTe, GaN, GaP, GaAs, GaSb, AlN, AlP, AlAs, AlSb, InP, InAs, InSb, SiC, Fe, Pt, Ni, Co, Al, Ag, Au, Cu, FePt, $Fe_2O_3$, $Fe_3O_4$, Si, Ge, and a combination comprising at least one of the foregoing materials.

12. The surface emitting device according to claim 11, wherein the quantum dots have a core-shell structure consisting of a core and an overcoating formed on the core, and the overcoating contains at least one material selected from the group consisting of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe PbTe, and a combination comprising at least one of the foregoing materials.

13. The surface emitting device according to claim 1, wherein the optical pumping means is a light-emitting diode or a laser diode.

14. A method for fabricating a surface emitting device, the method comprising:
   forming a first dielectric layer on a substrate;
   forming a second dielectric layer on the first dielectric layer;

patterning the second dielectric layer forming a patterned photonic crystal structure;

coating a polymer electrolyte on the patterned photonic crystal structure forming a polymer electrolyte layer; and coating a light-emitting material on the polymer electrolyte layer forming a light-emitting material layer.

15. The method according to claim 14, wherein the first dielectric layer is formed by a sol-gel process, chemical vapor deposition, or sputtering.

16. The method according to claim 14, wherein the patterning of the photonic crystal structure is performed by e-beam lithography, laser interference lithography, or deep UV photolithography.

17. The method according to claim 14, wherein the patterning the photonic crystal includes:

forming a photosensitive film on the first dielectric layer;

exposing the photosensitive film to light, followed by developing to obtain a photosensitive film pattern; and chemically etching the photosensitive film using the photosensitive film pattern as a mask to form the photonic crystal pattern.

18. The method according to claim 17, wherein the chemical etching is carried out by wet or dry etching.

19. The method according to claim 14, wherein the polymer electrolyte is selected from positively charged polymer electrolytes, negatively charged polymer electrolytes, and salts thereof.

20. The method according to claim 19, wherein the positively charged polymer electrolytes include polyallylamine and polyethylene imine, and the negatively charged polymer electrolytes include polyacrylic acid and polysulfonic acid.

21. The method according to claim 14, wherein the coating of the light-emitting material is carried out by coating a dispersion of quantum dots using a coating process selected from the group consisting of drop casting, spin coating, dip coating, spray coating, flow coating, screen printing, and ink-jet printing.

22. An optoelectronic device comprising an external resonator consisting of a pair of mirrors and a surface emitting device disposed within the external resonator, wherein the surface emitting device comprises;

a two-dimensional slab type photonic crystal structure including a first dielectric layer and a second dielectric layer formed on top of the first dielectric layer, wherein a plurality of air holes in a two-dimensional lattice pattern are formed on a surface of the second dielectric layer;

a light-emitting material layer formed on an inner wall defining the air holes; and optical pumping means for irradiating a lateral surface of the photonic crystal structure with light.

23. The optoelectronic device according to claim 22, wherein the optoelectronic device is a surface emitting laser.

24. The optoelectronic device according to claim 23, wherein the surface emitting laser further comprises a cutoff filter disposed in a region other than air holes of the surface emitting device.

25. The surface emitting device according to claim 1, wherein the light propagates from the light-emitting material layer in a direction perpendicular to a major plane defining the two-dimensional slab.

26. The surface emitting device according to claim 1, wherein the plurality of air holes are formed only in the second dielectric layer.

* * * * *